United States Patent [19]

Hidaka et al.

[11] Patent Number: 4,835,743

[45] Date of Patent: May 30, 1989

[54] SEMICONDUCTOR MEMORY DEVICE PERFORMING MULTI-BIT SERIAL OPERATION

[75] Inventors: Hideto Hidaka; Kazuyasu Fujishima; Hideyuki Ozaki; Kazutoshi Hirayama, all of Hyogo, Japan

[73] Assignee: Mitsubishi Denki Kabushiki Kaisha, Tokyo, Japan

[21] Appl. No.: 92,615

[22] Filed: Sep. 3, 1987

[30] Foreign Application Priority Data

Sep. 3, 1986 [JP] Japan ................................ 61-208401

[51] Int. Cl.$^4$ .............................................. G11C 7/00
[52] U.S. Cl. .................................... 365/193; 365/194
[58] Field of Search ................ 365/189, 230, 193, 194

[56] References Cited

U.S. PATENT DOCUMENTS 4,344,156  8/1982  Eator, Jr. et al. .................... 365/203
4,602,353  7/1986  Wawersig et al. ................... 365/193
4,675,850  6/1987  Kumanoya et al. ................. 365/230

OTHER PUBLICATIONS

IEEE Journal of Solid State Circuits-vol. SC-18, No. 5; Oct. 1983.
INMOS Inc., "100 ns 64K Dynamic Ram Using Efficient Redundancy Techniques", as presented at ISSCC, Feb. 18, 1981.

Primary Examiner—James W. Moffitt
Attorney, Agent, or Firm—Lowe, Price, LeBlanc, Becker & Shur

[57] ABSTRACT

In a semiconductor memory device capable of nibble mode operation, the time period required from the time when $\overline{CAS}$ signal falls to the time when a data output buffer activating signal rises is made different at the time of a normal mode and at the time of a nibble mode, so that the time period required for reading out data in the nibble mode is reduced as compared with a conventional device.

14 Claims, 7 Drawing Sheets

SEMICONDUCTOR MEMORY DEVICE PERFORMING MULTI-BIT SERIAL OPERATION

BACKGROUND OF THE INVENTION

1. Field of the Invention

The present invention relates to a semiconductor memory device and more particularly, to an improvement for operating at higher speed a semiconductor memory device with a fast access mode such as a nibble mode.

2. Description of the Prior Art

Conventional dynamic MOSRAM (dynamic random access memory having MOS transistors as components) includes a dynamic MOSRAM comprising a fast serial access mode referred to as a nibble mode.

Figure 1:
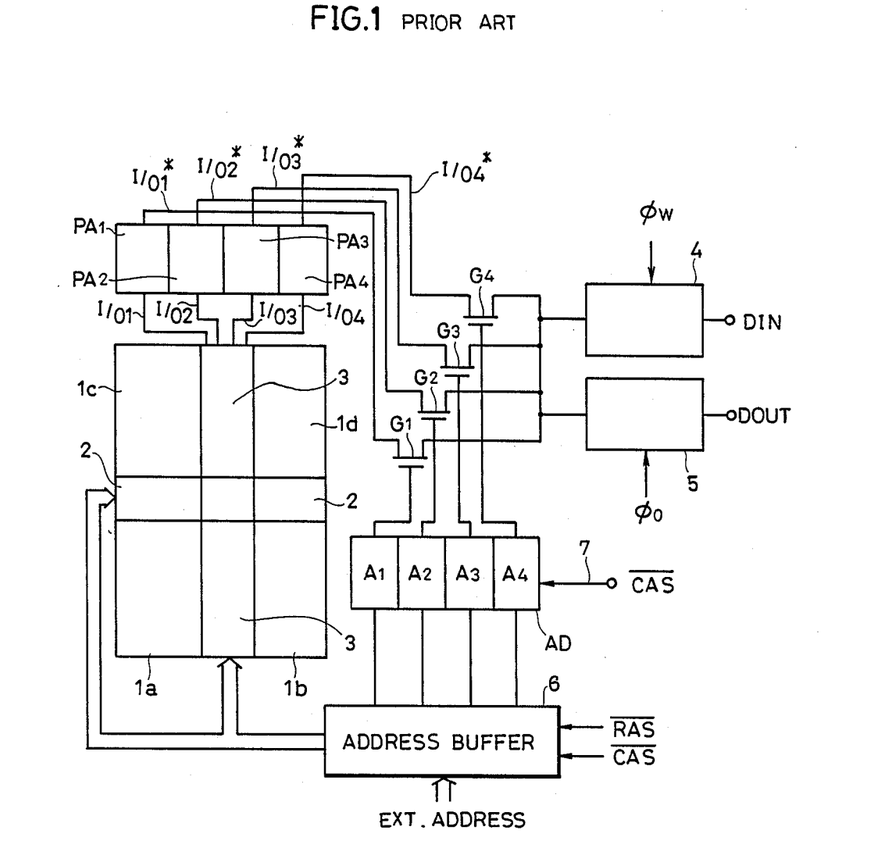
FIG. 1 is a diagram showing a schematic structure of a semiconductor memory device comprising a nibble mode.

FIG. 1 is a schematic diagram showing a structure of a dynamic MOSRAM with a nibble mode.

In FIG. 1, the conventional dynamic MOSRAM comprises a memory cell array divided into four array regions 1a, 1b, 1c and 1d for storing information, an X decoder 2 for decoding an address signal from an address buffer 6 and selecting a single word line from the memory cell arrays 1a to 1d, and a Y decoder 3 for decoding the address signal from the address buffer 6 and selecting four bit lines from the memory cell arrays 1a to 1d. The address buffer 6 receiving an external address signal for transferring to the X decoder 2 and the Y decoder 3 the address signal excluding two bits from the received external address signals. As a result, a four-bit memory cell is simultaneously selected from the memory cell arrays 1a to 1d. The remaining two bits from the address buffer 6 are applied to a four-bit address decoder AD. The four-bit address decoder decodes a two-bit address from the address buffer 6 and renders one of four transfer gates G1, G2, G3 and G4 conductive (an ON state).

A data input/output system comprises first data input/output lines I/O1, I/O2, I/O3 and I/O4 for sending to and receiving from memory cell arrays 1a to 1d four-bit information in parallel, four preamplifiers PA1, PA2, PA3 and PA4 connected to respective data input/output lines I/O1 to I/O4 for amplifying the applied information, second data input/output lines I/O1*, I/O2*, I/O3* and I/O4* for connecting respective preamplifiers PA1 to PA4 to a data input buffer 4 and a data output buffer 5 through the transfer gates G1, G2, G3 and G4, the data input buffer 4 responsive to an activating signal $\phi_W$ for sequentially transmitting data applied to a data input terminal $D_{in}$, the data output buffer 5 responsive to the activating signal $\phi_O$ for sequentially transmitting data applied through any of the transfer gates G1 to G4 to a data output terminal $D_{out}$ and the transfer gates G1, G2, G3 and G4 responsive to a signal from the address decoder AD to be turned on.

The address decider AD comprises four decoders A1, A2, A3 and A4. In addition, the address decoder AD functions as a shift register. More specifically, when a $\overline{CAS}$ signal for providing timing of a strobe of a column address is rendered active (an L level) twice or more while a $\overline{RAS}$ signal for providing timing of a strobe of a row address is active (the L level), the contents of the decoders A1 to A4 are shifted to the adjacent decoders in response to the second and subsequent fall of the $\overline{CAS0}$ signal. Thus, a transfer gate selected by the address decoder AD being turned on in response to the first fall of the $\overline{CAS}$ signal is turned off in response to the fall of the next $\overline{CAS}$ signal, so that the ON state of the first selected transfer gate is shifted to the adjacent transfer gate. In the nibble mode, the $\overline{CAS}$ signal is rendered active four times while $\overline{RAS}$ signal is active. Therefore, the four-bit memory cells are sequentially accessed in response to one addressing.

Figure 2:
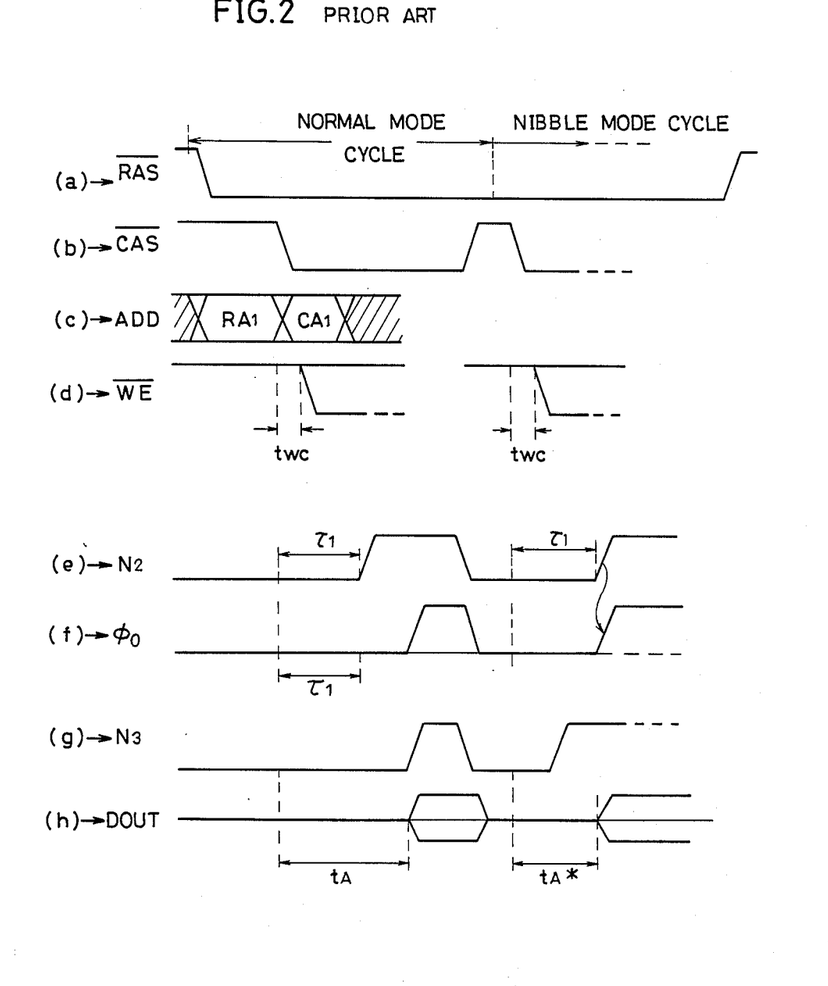
FIG. 2 is a waveform diagram showing reading operation of the semiconductor memory device shown in FIG. 1 and operation of a decision on circuit.

FIG. 2 is a waveform diagram showing operation of the semiconductor memory device shown in FIG. 1. In FIG. 2, signal waveforms N2 and N3 used in a read/write decision circuit as described below are also shown. In FIG. 2, the signal $\phi_W$ for activating the data input buffer 4 is not shown. However, the signal $\phi_W$ is shifted to an active state in response to the later active state of the active state of the $\overline{CAS}$ signal and the active state of a write enable signal for designating write/read operation. Referring now to FIGS. 1 and 2, description is made on an operation at the time of reading (a $\overline{WE}$ signal remains at the H level).

The $\overline{RAS}$ signal falls to be rendered active, so that a row address RA1 is latched to the address buffer 6 and then, applied to the X decoder 2. Therefore, a single word line is selected from the memory cell arrays 1a to 1d. When the $\overline{CAS}$ signal falls to be rendered active, a column address CA1 is latched to the address buffer 6 and then, transferred to the Y decoder 3. The column address excluding two bits are transferred to the Y decoder 3 from the address buffer 6, and the remaining two bits are applied to each of the decoders A1 to A4 of the address decoder AD. As a result, the four-bit memory cells are selected by the Y decoder 3, so that information of the selected four-bit memory cells is applied to each of the preamplifiers PA1 to PA4. On the other hand, the address decoders A1 to A4 decode applied two-bit information and turn one of the transfer gates G1 to G4 on. Therefore, one of the preamplifiers PA1 to PA4 is connected to the input buffer 4 and the output buffer 5. Then, the signal $\phi_O$ is rendered active, the output buffer 5 is activated, and information of selected one of the preamplifiers PA1 to PA4 is applied to the output terminal $D_{out}$ through the output buffer 5 as output data after a lapse of a time period $t_A$ from the fall of the $\overline{CAS}$ signal. After the $\overline{RAS}$ signal is rendered active, a cycle which is started in response to the fall of the first $\overline{CAS}$ signal is always a normal cycle, so that a memory cell designated by an external address Ext. ADD is selected.

When the $\overline{CAS}$ signal rises once and falls again, the nibble mode is started. In the cycle, the contents of the address decoders A1 to A4 are shifted to adjacent address decoders in response to the second fall of the $\overline{CAS}$ signal. Accordingly, a transfer gate adjacent to the transfer gate which is first turned on is turned on, so that information of a corresponding preamplifier out of the preamplifiers PA1 to PA4 is applied to the output buffer 5. The signal $\phi_O$ is rendered active again, and information of an adjacent memory cell is transmitted to the output terminal $D_{out}$ through the output buffer 5 after a lapse of a time period $t_A^*$ from the fall of the $\overline{CAS}$ signal. The access time $t_A^*$ at that time is much shorter than the access time $t_A$ at the time of the normal mode. When the operation is further repeated twice the RAS signal is active, information of a memory cell designated by the external address signal and three-bit memory cells continuously adjacent to the memory cell are sequentially read out at high speed.

When data is written, the write enable signal $\overline{WE}$ is rendered active in the same manner as the $\overline{CAS}$ signal. Accordingly, the signal $\phi_W$ is rendered active, so that data from the data input terminal $D_{in}$ are sequentially written into the corresponding memory cells through the input buffer 4.

In data write operation, operation modes referred to as an early write mode and a delayed write mode are known.

In the early write mode, the $\overline{WE}$ signal falls ($t_{WC}<0$ in FIG. 2) before the $\overline{CAS}$ signal falls, data are not outputted to the data output terminal $D_{out}$ (a $D_{out}$ signal in a high impedance state), and data applied to the data input terminal $D_{in}$ are written into the corresponding memory cells in response to the fall of the $\overline{CAS}$ signal.

In the delayed write mode, after a lapse of a predetermined time period from the fall of the $\overline{CAS}$ signal ($t_{WC}>0$), the $\overline{WE}$ signal falls. Accordingly, the $\phi_W$ signal is rendered active. In the delayed write mode, valid data are outputted to the data output terminal $D_{out}$ from the data output buffer 5 and then, data applied to the data input terminal Din are written into a corresponding memory cell.

Figure 3:
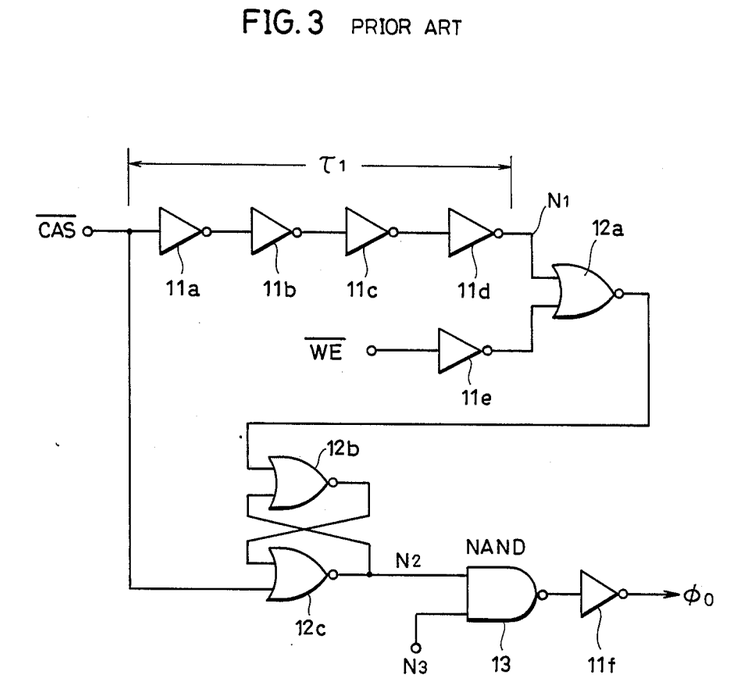
FIG. 3 is a diagram showing a structure of a conventional read/write decision circuit for outputting an output buffer activating signal.

It is determined by the circuit shown in FIG. 3 whether or not the output of the output buffer 5 is rendered a high impedance state or a valid state.

FIG. 3 is a diagram showing a specific structure of a read/write decision circuit. In FIG. 3, the decision circuit comprises four-stage inverters 11a, 11b, 11c and 11d connected in series receiving the $\overline{CAS}$ signal for delaying the same by a predetermined time period $\tau 1$ and outputting the same, an inverter 11e receiving the $\overline{WE}$ signal for inverting and outputting the same, an NOR gate 12a receiving outputs of the inverter 11d and the inverter 11e, an NOR gate 12b having one input receiving an output of the NOR gate 12a and other input receiving a signal N2 of an output of an NOR gate 12c, the NOR gate 12c having one input receiving an output of an NOR gate 12b and other input receiving the $\overline{CAS}$ signal, an NAND gate 13 receiving an output (N2) of the NOR gate 12c and a signal N3, and an inverter 11f receiving an output of the NAND gate 13 for inverting the same to output the buffer activating signal $\phi_O$.

The NOR gates 12b and 12c constitute a flip-flop. The signal N2 is at the L level when both the $\overline{CAS}$ signal and the $\overline{WE}$ signal are at the H level. The signal N3 is obtained by delaying the $\overline{CAS}$ signal by a predetermined time period and inverting the same. More specifically, at the time of the normal mode (the first cycle), the preamplifiers PA1 to PA4 operate, and the signal N3 rises after data are read put to an input portion of the output buffer 5. In addition, at the time of the nibble mode, the signal N3 rises immediately after the transfer gates G1 to G4 are switched in response to the fall of the $\overline{CAS}$ signal. Description is now made on operation.

While the $\overline{CAS}$ signal is at the H level, the signal N1 is at the H level. On the other hand, when the $\overline{WE}$ signal is at the H level, the output of the inverter 11e is at the L level. Thus, the output of the NOR gate 12a is at the L level at that time. In this state, since the output of the NOR gate 12c is at the L level and the signal N3 is also at the L level, the signal $\phi_O$ is at the L level.

When the $\overline{CAS}$ signal falls, the normal mode is started. The signal N1 falls after a lapse of the delay time $\tau 1$ from the fall of the $\overline{CAS}$ signal. At that time, if signal $\overline{WE}$ remains at the L level (in the read cycle), the output of the NOR gate 12a rises to the H level. The output state of the NOR gate 12c is inverted in response to the rise of the output of the NOR gate 12a, so that the signal N2 rises. Then, when the signal N3 rises after a lapse of a predetermined time period from the fall of the $\overline{CAS}$ signal, the output of the NAND gate 13 falls to the L level. Accordingly, the activating signal $\phi_O$ rises. Therefore, the output buffer 5 is activated, so that valid data are outputted to the output terminal $D_{out}$ from the output buffer 5. When the $\overline{CAS}$ signal rises and falls again, the nibble mode is started. At that time, in the same manner as the above described operation, the signal N2 falls after a lapse of the delay time $\tau 1$ from the fall of the $\overline{CAS}$ signal. On the other hand, at the time of the nibble mode, since the signal N3 rises immediately after the transfer gates G1 to G4 are switched, the signal N3 rises before the signal N2 rises. Thus, at the time of the nibble mode the signal $\phi_O$ rises immediately after a lapse of the delay time $\tau 1$ so that the output buffer 5 is activated.

On the other hand, at the time of the early write mode, the $\overline{WE}$ signal falls before the $\overline{CAS}$ signal falls. Thus, the output of the NOR gate 12a remains at the L level. Therefore, in this case, even if the $\overline{CAS}$ signal falls, the output of the NOR gate 12c remains at the L level. Thus, even if the signal N3 rises, the output of the NAND gate 13 remains at the H level. Accordingly, the signal $\phi_O$ attains the L level, so that the output buffer 5 is not activated. Therefore, in the early write mode, the output state of the output buffer 5 becomes the high impedance state, so that valid data are not read out. As a result, the early write mode and the write cycle mode can be differentiated. In the above described structure, at the time of the normal access mode, the rise of the signal $\phi_O$ is determined by the signal N3 which rises after the preamplifiers PA1 to PA4 operate and data are transmitted to the input portion of the output buffer. Thus, the delay time of the signal N3 with respect to the $\overline{CAS}$ signal determines the access time (the time required for activating the output buffer 5 from the fall of the $\overline{CAS}$ signal), so that the delay time $\tau 1$ of the signal N2 with respect to the $\overline{CAS}$ signal is not the access time. However, in the nibble mode, since the signal N3 rises immediately after the transfer gates G1 to G4 are switched, the rise of the signal $\phi_O$ is determined by the delay time $\tau 1$ of the signal N2 with respect to the $\overline{CAS}$ signal. Thus, the access time in the nibble mode is determined by the delay time $\tau 1$.

In practice, the delay time $\tau 1$ is increased to provide a margin for timing of the fall of the $\overline{WE}$ signal to perform early write operation at the time of the normal mode. Therefore, there is a problem that the access time in the nibble mode is longer than needed, due to the delay time of the read/write decision circuit.

A general structure and operation of the conventional semiconductor memory device comprising the nibble mode is described in U.S. Pat. No. 4,344,156, and a catalogue INMOS Inc. "100ns 64K Dynamic Ram Using Efficient Redundancy Techniques".

SUMMARY OF THE INVENTION

An object of the present invention is to remove a disadvantage of the above described conventional semiconductor memory device comprising a nibble mode and to provide a semiconductor memory device capable of reducing the access time in the nibble mode while providing a margin for timing of the read/write determination at the time of the normal mode.

The semiconductor memory device according to the present invention is adapted such that timing for generating an output buffer activating signal generated by a decision circuit can be switched in response to the normal mode or the nibble mode.

More specifically, the present invention is directed to a semiconductor memory device, in which the time period required from the time when the $\overline{CAS}$ signal falls to the time when a data output buffer activating signal rises is made different at the time of the nibble mode and at the time of the normal mode, so that the time period required for reading out data at the time of the nibble mode is reduced.

As described in the foregoing, since timing for activating a data output buffer at the time of the nibble mode is faster than that at the time of the normal mode, the time period required for reading out data at the time of the nibble mode can be reduced as compared with the conventional device, so that faster accessing becomes possible.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
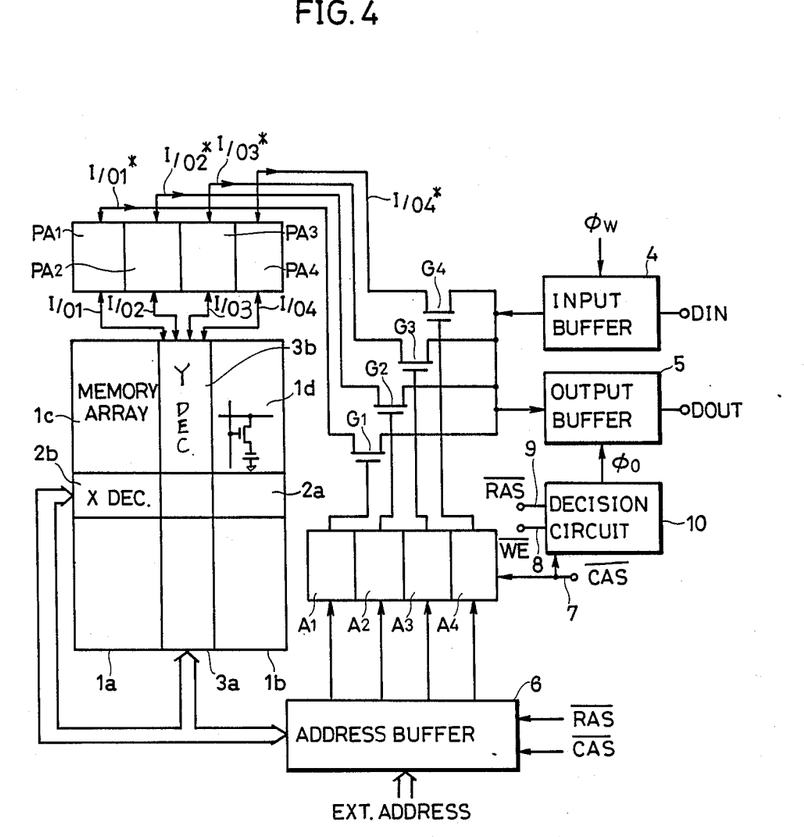
FIG. 4 is a diagram showing a structure of a semiconductor memory device according to an embodiment of the present invention.

FIG. 4 is a diagram showing a structure of a semiconductor memory device according to an embodiment of the present invention. Portions identical or corresponding to those of a conventional semiconductor memory device shown in FIG. 1 have the identical reference numerals.

In FIG. 4, a decision circuit 10 capable of switching timing for generating an output buffer activating signal in response to the normal mode or the nibble mode is newly provided. The decision circuit 10 switches the timing for generating the output buffer activating signal $\phi_O$ in the normal access and in the nibble access and applies the signal $\phi_O$ to an output buffer 5 in response to a column address strobe signal $\overline{CAS}$ applied through an input terminal 7, a write enable signal $\overline{WE}$ applied through an input terminal 8 and a row address strobe signal $\overline{RAS}$ applied through an input terminal 9. In the nibble mode, the delay time from the time at which the $\overline{CAS}$ signal is shifted to an active state to the time at which the signal $\phi_O$ is rendered active is minimized. The other structure is the same as that of the conventional semiconductor memory device shown in FIG. 1.

Figure 5:
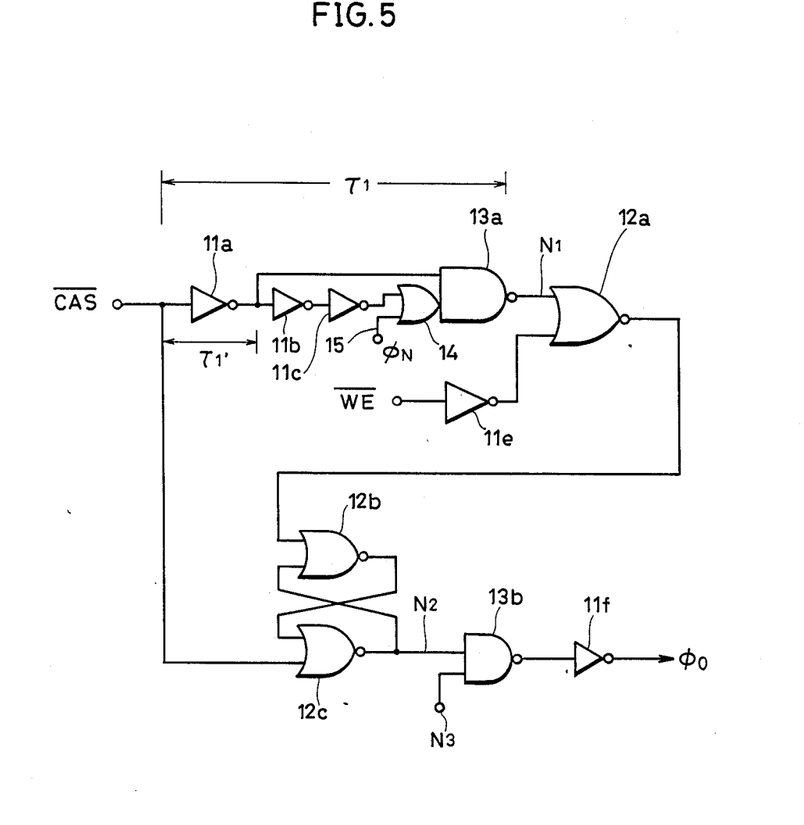
FIG. 5. is a diagram showing a structure of a read/write decision circuit for generating an output buffer activating signal used in a semiconductor memory device according to an embodiment of the present invention.

FIG. 5 is a diagram showing a structure of an activating signal generating portion of the decision circuit shown in FIG. 4. In FIG. 5, the activating signal generating portion comprises inverters 11a, 11b and 11c receiving the $\overline{CAS}$ signal for delaying the received signal by a predetermined delay time and inverting and outputting the same, an OR gate 14 receiving a control signal $\phi_N$ and a signal from the inverter 11c, an NAND gate 13a receiving outputs of the inverter 11a and the OR gate 14, an inverter 11e receiving the $\overline{WE}$ signal and inverting the same to output, an NOR gate 12a receiving outputs of the inverter 11e and the NAND gate 13a, an NOR gate 12b having one input receiving an output of the NOR gate 12a and other input receiving an output (N2) of an NOR gate 12c, the NOR gate 12c receiving an output of the NOR gate 12b and the $\overline{CAS}$ signal, an NAND gate 13b receiving an output of the NOR gate 12c and a signal N3, and an inverter 11f receiving an output of the NAND gate 13b and inverting the same to output the activating signal $\phi_O$. The NOR gates 12b and 12c constitute a flip-flop. In addition, the signal N3 is generated at the same timing as that described with reference to FIG.3. Furthermore, the inverters 11a to 11c and the OR gate 14 provide a delay time $\tau1$ to the signal N1 with respect to the signal $\overline{CAS}$. Thus, in the structure shown in FIG. 5, the OR gate 14 receiving an output of the inverter 11c and the signal $\phi_N$ and an NAND gate 22 receiving the outputs of the inverter 11a and the OR gate 14 are provided in place of the inverter 11d shown in FIG. 3.

Figure 6:
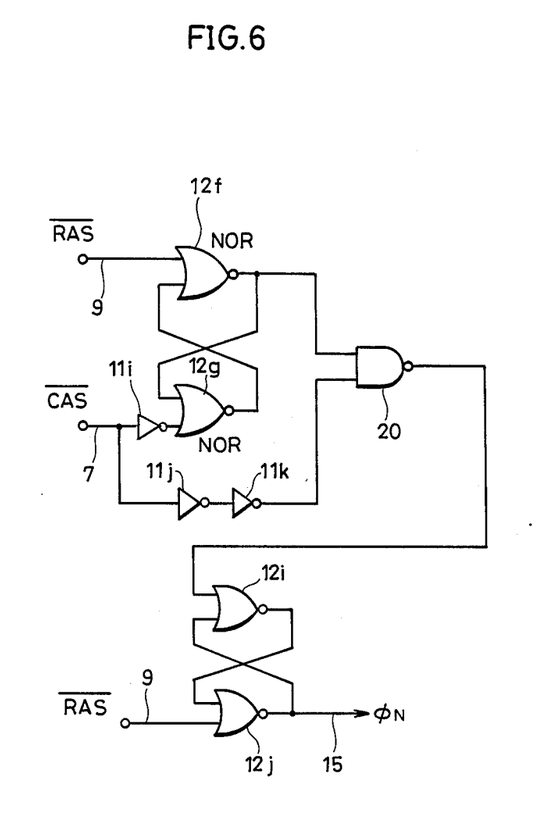
FIG. 6 is a diagram showing a structure of a control signal $\phi_N$ generating circuit used in the decision circuit shown in FIG. 5.

FIG. 6 is a diagram showing a circuit for generating the control signal N shown in FIG. 5. In FIG. 6, a control signal generating circuit: comprises an NOR gate 12f having one input receiving the $\overline{RAS}$ signal applied through the input terminal 9 and other input receiving an output of an NOR gate 12g, the NOR gate 12g having one input receiving an output of the NOR gate 12f and other input receiving the $\overline{CAS}$ signal applied through the input terminal 7 and an inverter 11i, an inverter 11g receiving the output of the NOR gate 12f, two-stage inverters 11j and 11k connected in series receiving the $\overline{CAS0}$ signal applied through the input terminal 7 for transmitting the same, an AND gate 20 receiving an output of an inverter 11k and the output of the NOR gate 12f an NOR gate 12i having one input receiving an output of the AND gate 20 and other input receiving an output of an NOR gate 12j, and the NOR gate 12j having one input receiving an output of the NOR gate 12i and other input receiving the $\overline{RAS}$ signal applied through the input terminal 9. The output of the NOR gate 12j becomes the control signal $\phi_N$. In addition, the NOR gates 12f and 12g constitute a flip-flop, and the NOR gates 12i and 12j also constitute a flip-flop.

In an early write/read decision circuit shown in FIGS. 5 and 6, the time period from the time at which the $\overline{CAS}$ signal falls to the time at which the signal N2 rises is switched by the control signal $\phi_N$ depending on the normal mode and the nibble mode.

Figure 7:
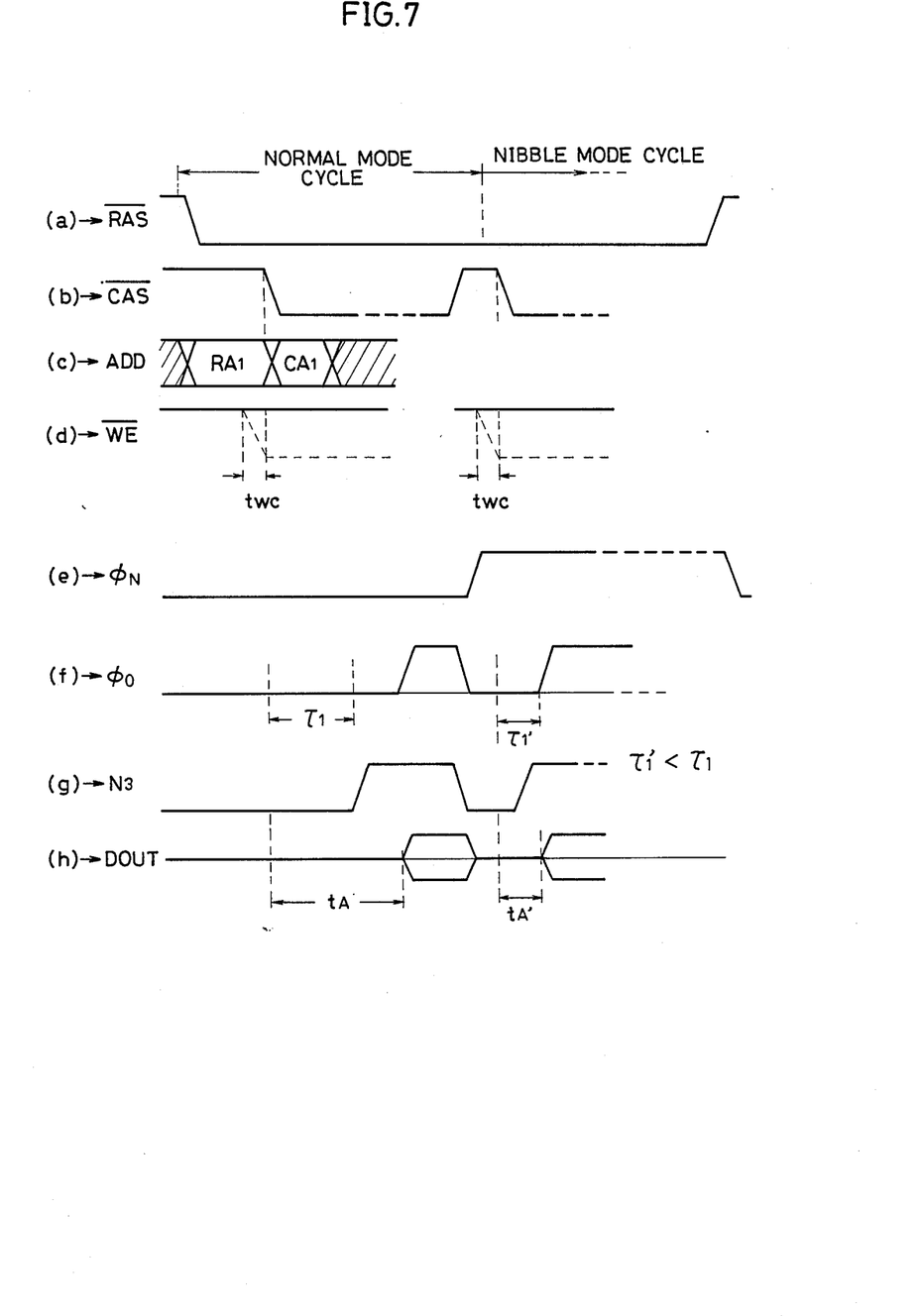
FIG. 7 is a waveform diagram showing operation of the circuits shown in FIGS. 4 to 6.

FIG. 7 is a waveform diagram showing operation of the circuit shown in FIGS. 4 to 6. Referring now to FIGS. 4 to 7, description is made on operation of the semiconductor memory device according to an embodiment of the present invention.

When both the $\overline{RAS}$ signal and the $\overline{CAS}$ signal are at an H level, the output of the NOR gate 12f is at the L level and the output of the inverter 11k is at the H level, so that the output of the AND gate 20 is at the L level. Thus, the output of the NOR gate 12j is at the L level. Even if the $\overline{RAS}$ signal falls, the output of the NOR gate 12f remains at the L level and the output of the AND gate 20 also remains at the L level. Thus, the control signal $\phi_N$ also remains at the L level. When the $\overline{CAS}$ control signal then falls, the output of the inverter 11i attains the H level and the output of the NOR gate 12f attains the H level. However, since the signal at the L level is applied to one input of the AND gate 20 through the inverter 11k, the output of the AND gate 20 remains at the L level and the control signal $\phi_N$ remains at the L level. Since the control signal $\phi_N$ is applied to one input of the OR gate 14, the output of the OR gate 14 is the same signal as the output of the inverter 11c when the control signal $\phi_N$ is at the L level. Thus, the output of the OR gate 14 rises after a lapse of about the time period $\tau 1$ from the fall of the $\overline{CAS}$ signal. Since a signal which has already risen is applied to one input of the NAND gate 13a from the inverter 11a, the output of the NAND gate 13a falls after a lapse of the time period $\tau 1$ from the fall of the $\overline{CAS}$ signal. If the $\overline{WE}$ signal is at the H level (at the time of the data read cycle), the output of the NOR gate 12a rises in response to the output of the NAND gate 13a. Accordingly, the signal N2 also rises. As a result, in the same manner as in the conventional structure shown in FIG. 3, when the signal N3 rises, the signal $\phi_O$ also rises, so that the output buffer 5 is activated. On the other hand, if the $\overline{WE}$ signal has already fallen when the $\overline{CAS}$ signal falls, the output of the NOR gate 12a does not change, so that the signal N2 remains at the L level. As a result, the signal $\phi_O$ remains at the L level and the output buffer 5 is not activated, so that a signal in a high impedance state is transmitted to an output terminal $D_{out}$. More specifically, if the first cycle is a normal read cycle, data are read out to the output terminal $D_{out}$ after a lapse of time period $t_4$ from the first fall of the $\overline{CAS}$ signal in the same manner as in the conventional structure.

When the $\overline{CAS}$ signal then rises, a signal at the L level is applied to one input of the NOR gate 12g through the inverter 11i, so that the output of the NOR gate 12f remains at the H level and the output of the inverter 11k attains the H level. Accordingly, the output of the AND gate 20 attains the H level. Therefore, the output of the NOR gate 12j attains the H level and the control signal $\phi_N$ rises to the H level. The control signal $\phi_N$ remains at the H level to the time at which the $\overline{RAS}$ signal rises and the $\overline{RAS}$ cycle is ended. As a result, at the time of the second and subsequent falls of the $\overline{CAS}$ signal, the signal N1 falls after a lapse of the delay time of one stage of the gate from the fall of the $\overline{CAS}$ signal (the delay time by the inverter 11a). Thus, at the time of the nibble read cycle in which the $\overline{WE}$ signal is at the H level, the signal N2 rises after a lapse of the delay time $\tau 1'$ from the fall of the $\overline{CAS}$ signal. Accordingly, the signal $\phi_O$ rises. As a result, the access time $t_A'$ for reading out data in the nibble mode is much shorter than the conventional access time $t_A^*$.

Also in the above described embodiment, four bit serial access referred to as the nibble mode is described, it is not intended to limit it. For example, the present invention can be applied to multi-bit serial access such as eight bit serial access and the like.

Additionally, although a structure of a dynamic MOSRAM (random access memory) is described by way of an example of a memory device, the present invention can be applied to a memory device having another structure such as CMOSRAM and the like.

As described in the foregoing, according to the present invention, since in a semiconductor memory device capable of multi-bit serial access, timing for activating a data output buffer is different at the time of a normal mode and at the time of a serial access mode subsequent thereto, the access time of the serial access mode can be reduced as compared with the conventional device, so that a semiconductor device capable of reading out data at higher speed as compared with the conventional semiconductor device can be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device capable of performing multi-bit serial access operation, comprising decision means responsive to activation timing of a column strobe signal and a write enable signal in each access cycle in said multi-bit serial access operation for activating a data output buffer, said multi-bit serial access operation comprising a first applied access cycle and access cycles subsequent to said first access cycle, said decision means comprising:
    means responsive to a row address strobe signal and said column address strobe signal for generating a control signal,
    delay means responsive to said control signal for providing different delay times to said column address strobe signal whereby said column address strobe signal is activated with different delay times in said normal mode and in said fast access mode and
    means responsive to an output of said delay means and to said write enable signal for generating an activating signal to activate said data output buffer.

2. A semiconductor memory device in accordance with claim 1, wherein
    said control signal is rendered active after first active state of said column address strobe signal is ended while said row address strobe signal is active, said control signal being active until the active state of said row address strobe signal is ended.

3. A semiconductor memory device in accordance with claim 1, wherein
    means for generating said control signal comprises
        first flip-flop means receiving said row address strobe signal and said column address strobe signal,
        logic means responsive to said column address strobe signal and an output of said first flip-flop means for generating a signal which changes in response to the second and subsequent transition of said column address strobe signal while said row address signal is active, and
        second flip-flop means responsive to said row address strobe signal and an output of said logic means for generating said control signal.

4. A semiconductor memory device in accordance with claim 1, wherein
    said delay switching means comprises
        first delay means receiving said column address strobe signal for delaying the same by a first time period, second delay means for delaying said column address strobe signal by a second time period, and a logic gate receiving outputs of said first and second delay means and said control signal for transmitting the output of said first delay means when said control signal is at an active state and passing the output of said second delay means when said control signal is at an inactive state.

5. A semiconductor memory device in accordance with claim 4, wherein said logic gate comprises an OR gate receiving said control signal and an output of said second delay means, and an NAND gate receiving the output of said first delay means and an output of said OR gate.

6. A semiconductor memory device in accordance with claim 1, wherein said delay time in said normal mode is longer than that in said fast access mode.

7. A semiconductor memory device comprising:

a memory cell array including a plurality of memory cells arranged in a matrix of rows and columns;

a column decoder activated in response to a first level of a column address strobe signal for selecting memory cells disposed on columns in said memory cell array, based on a received predetermined set of column address signals;

a row decoder activated in response to the first level of a row address strobe signal for selecting memory cells disposed on a row in said memory cell array based on a received predetermined set of row address signals;

input/output means for transferring data stored in the memory cells selected by said row and column decoders and for transferring data to be written into the selected memory cells;

an address decoder receiving remaining column and row address signals other than said predetermined row and column address signals in said row and column address signals;

transfer means, operable under control of said address decoder, for transferring data received from said input/output means and for transferring received data to said input/output means;

data input buffer, operable in response to a first activating signal for data-writing and coupled to said transfer means, for receiving said data to be written;

data output buffer, operable in response to a second activating signal for data-reading-out and coupled to said transfer means; and decision means, receiving said column and row address strobe signals and a write enable signal, for generating said second activating signal for data-reading-out, said decision means operable to change the level of said second activating signal from a second level to a first level for activating said output buffer in a first delay time when said decision means detects a first produced transition from said second level to said first level in said column address strobe signal while said row address strobe signal is at the first level, and also operable to change the level of said second activating signal from the second level to the first level in a second delay time shorter than said first delay time when said decision means detects second and subsequently produced transitions in said column address strobe signal while said row address strobe signal is at the active first level.

8. A semiconductor memory device in accordance with claim 7, wherein said decision means comprises:

means responsive to said column and row address strobe signals for generating a switching signal the level of which is changed from the second level to the first level in response to the second produced transition from the second level to the first level in said column address strobe signal while said row address strobe signal is at the first level;

means responsive to said column address strobe signal and said switching signal for producing said second activating signal;

said second activating signals changing the level thereof from the second level to the first level in said first delay time when said column address strobe signal changes the level thereof from the second level to the first level while said switching signal is at the second level, and also changing the level thereof from the second level to the first level in said second delay time when said column address strobe signal goes from the second level to the first level while said switching signal is at the first level.

9. A semiconductor memory device in accordance with claim 8, wherein said means for generating said switching signal comprises first flip-flop means receiving said row address strobe signal and said column address strobe signal, logic means responsive to said column address strobe signal and an output of said first flip-flop means for generating a signal which changes the level thereof in response to the second and subsequent transition of said column address strobe signal while said row address signal is the active first level, and second flip-flop means responsive to said row address strobe signal and an output of said logic means for generating said switching signal.

10. A semiconductor memory device in accordance with claim 8, wherein said decision means comprises:

a first delay means for delaying said column address strobe signal by the first time period;

a second delay means coupled in series to said first delay means for delaying an output from said first delay means by a third time period so as to delay said column address strobe signal by the second time period;

an OR gate receiving said switching signal and an output form said second delay means;

a NAND gate receiving an output from said OR gate and an output from said first delay means;

a NOR gate receiving an output from said NAND gate and a write enable signal; and a flip-flop means receiving said column address strobe signal and an output from said NOR gate to produce said second activated signal.

11. A semiconductor memory device in accordance with claim 10, wherein said flip-flop means comprises a flip-flop comprising a pair of cross-coupled NOR gates, and NAND gate receiving an output from said flip-flop and a delayed and inverted column address strobe signal.

12. A semiconductor memory device in accordance with claim 8, wherein said means for generating said second activating signal comprises first delay means receiving said column address strobe signal for delaying the same by the first time period, second delay means for delaying said column address strobe signal by the second time period, and a logic gate receiving outputs of said first and second delay means and said switching signal for transmitting the output of said first delay means when said switching signal is at the first level and passing the output of said second delay means when said switching signal is at the second level.

13. A semiconductor memory device in accordance with claim 12, wherein said logic gate comprises an OR gate receiving said switching signal and an output of said second delay means, and a NAND gate receiving the output of said first delay means and an output of said OR gate.

14. In a semiconductor memory device capable of performing multi-bit serial access operations having means responsive to activation timing of a column address strobe signal and a write enable signal, in each access cycle in said multi-bit serial access operation, for activating a data output buffer, and said memory device being operable in a first applied access cycle (normal mode) and access cycles subsequent thereto (6fast access mode), a method of controlling said output buffer, comprising the steps of:

in response to a row address strobe signal and said column address strobe signal, generating a control signal indicative of said fast access mode;

in response to said control signal, activating said column address strobe signal with different time delays when said multi-bit serial access operation is in said normal mode and fast access mode, respectively; and activating said output buffer in accordance with said write enable signal and said different time delays.

* * * * *